(12) United States Patent
Govoreanu

(10) Patent No.: US 10,490,738 B2
(45) Date of Patent: Nov. 26, 2019

(54) RESISTIVE SWITCHING MEMORY CELL

(71) Applicant: IMEC VZW, Leuven (BE)

(72) Inventor: Bogdan Govoreanu, Hulshout (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/625,941

(22) Filed: Jun. 16, 2017

(65) Prior Publication Data

US 2017/0358742 A1    Dec. 14, 2017

Related U.S. Application Data

(63) Continuation of application No. PCT/EP2015/080412, filed on Dec. 18, 2015.

(30) Foreign Application Priority Data

Dec. 19, 2014  (EP) .................................... 14199351
Jan. 15, 2015  (EP) .................................... 15151313

(51) Int. Cl.
*H01L 45/00*     (2006.01)
*G11C 13/00*     (2006.01)
*H01L 27/24*     (2006.01)

(52) U.S. Cl.
CPC ............ *H01L 45/08* (2013.01); *G11C 13/004* (2013.01); *G11C 13/0007* (2013.01);
(Continued)

(58) Field of Classification Search
CPC ... H01L 45/08; H01L 45/1233; H01L 45/146; G11C 2213/56; G11C 2213/77
See application file for complete search history.

(56) References Cited

U.S. PATENT DOCUMENTS

2010/0155722 A1    6/2010  Meyer
2011/0140068 A1    6/2011  Ozawa et al.
(Continued)

FOREIGN PATENT DOCUMENTS

WO    WO 2016/097252 A1    6/2016

OTHER PUBLICATIONS

International Search Report and Written Opinion received in PCT Application No. PCT/EP2015/080412, dated Feb. 18, 2016 in 14 pages.
(Continued)

*Primary Examiner* — Allison Bernstein
(74) *Attorney, Agent, or Firm* — Knobbe, Martens, Olson & Bear, LLP

(57) ABSTRACT

In one aspect, a resistive switching memory device includes a first electrode and a second electrode having interposed therebetween a first inner region and a second inner region, where the first and second inner regions contacting each other. The first inner region includes one or more metal oxide layers and the second inner region consists of a plurality of layers, where each of the layers of the second inner region is an insulating, a semi-insulating or a semi-conducting layer. The second inner region comprises one or more layers having a stoichiometric or off-stoichiometric composition of a material selected from the group consisting of $SiGe_x$, $SiN_x$, $AlO_x$, $MgO_x$, $AlN_x$, $HfO_x$, $HfSiO_x$, $ZrO_x$, $ZrSiO_x$, $GdAlO_x$, $DyScO_x$, $TaO_x$ and combinations thereof. The second inner region comprises one or more silicon-containing layers, such that one of the one or more silicon-containing layers contacts the first inner region.

19 Claims, 7 Drawing Sheets

(52) U.S. Cl.
CPC ........ *G11C 13/0069* (2013.01); *H01L 27/249* (2013.01); *H01L 27/2463* (2013.01); *H01L 45/12* (2013.01); *H01L 45/1226* (2013.01); *H01L 45/1233* (2013.01); *H01L 45/146* (2013.01); *H01L 45/147* (2013.01); *H01L 45/148* (2013.01); *H01L 45/1641* (2013.01); *G11C 2213/15* (2013.01); *G11C 2213/56* (2013.01); *G11C 2213/71* (2013.01); *G11C 2213/77* (2013.01)

(56) References Cited

U.S. PATENT DOCUMENTS

| | | |
|---|---|---|
| 2012/0091427 A1 | 4/2012 | Chen et al. |
| 2014/0038380 A1* | 2/2014 | Pham ................ H01L 45/1608 438/382 |
| 2014/0268993 A1 | 9/2014 | Chiang et al. |
| 2014/0363948 A1* | 12/2014 | Tendulkar ............... H01L 45/08 438/382 |

OTHER PUBLICATIONS

Official Communication dated Apr. 16, 2019 in Application No. EP 15151313.2, EPC counterpart priority, in 5 pages.

\* cited by examiner

RESISTIVE SWITCHING MEMORY CELL

CROSS-REFERENCE TO RELATED APPLICATIONS

This application is a continuation of PCT Application No. PCT/EP2015/080412, filed on Dec. 18, 2015, which claims priority to European Patent Application No. EP 14199351.9, filed on Dec. 19, 2014, and to European Patent Application No. EP 15151313.2, filed on Jan. 15, 2015. Each of the above applications is incorporated herein by reference in its entirety.

BACKGROUND

Field

The disclosed technology generally relates to semiconductor devices and more particularly to memory or storage devices based on resistive switching.

Description of the Related Technology

Resistive random access memory (RRAM) technology is a promising non-volatile memory technology candidate to potentially succeed flash memory technology, due to its simple structure and a potential for low-power operation. Recently, RRAM technologies having resistive memory cells arranged in cross-bar or cross-point configurations have attracted considerable attention due to their potential for high bit-density integration. Memory arrays having cross-bar architectures, sometimes called cross-bar arrays or cross-point arrays, have a first plurality of conductive lines (e.g., bit lines) and a second plurality of conductive lines (e.g., wordlines) that cross the first conductive lines, and a plurality of memory cells formed at intersections of the first and second conductive lines. The memory cells include a resistive switching element that can switch between a high resistance state and a low resistance state in response to a current signal or a voltage signal. Despite the promising attributes, several technological challenges have been identified in implementing resistive memory devices having cross-bar architectures, including suppressing leakage currents through unselected/inhibited cells and delivering high drive currents through selected target cells during operation of the cross-bar arrays.

Various resistive random access memory (RRAM) devices can provide numerous advantages. For example, RRAM can be operated at low voltages and/or using low power, and can have fast read and write (switching) access times. Some RRAM devices can be nonvolatile and the states of the RRAM devices can be stable over a long time, i.e., the RRAM devices can provide long data retention times. Furthermore, some RRAM devices can be scalable, e.g., when implemented in a cross-bar configuration.

Implementation of RRAM devices in large nonvolatile RRAM arrays, however, have been lagging behind device research advances, in part due to the lack of an appropriate selector element and/or due to unavailability of a resistive self-rectifying (hence selectorless) switching memory cell with highly nonlinear current-voltage characteristics, which can fit in a pitch-size cross-point array, or in a vertical RRAM string. The problem is made even more stringent when, considering limitations in switching current levels imposed by addressing large memory arrays or by power consumption, a restriction in the amount operational (e.g., write and read) currents, e.g., in the range of μA or below, is added.

Leakage current paths formed through unselected memory cells during operation of the cross-bar arrays are referred to in the industry as "sneak current paths." During operation of a cross-bar array, when addressing a selected target selected memory cell, parasitic current can flow through the sneak current paths formed through unselected memory cells that are in low resistance states. Such leakage currents can reduce the signal to noise ratio in reading the selected memory cell, which can in turn increase the rate of error in reading. The sneak path problem can be more pronounced in passive arrays, especially situations where the low resistive state of the memory cell exhibits linear, or nearly linear current-voltage (IV) characteristics. Such linear or nearly linear I-V characteristics can result in a low signal-to-noise ratio, and can lead to a cell being misread due to the parasitic sneak current path via low resistance state neighbours.

To reduce the leakage currents through the unselected memory cells during operation, some cross-bar arrays employ selector devices. The selector devices can be two-terminal devices such as diodes, or three-terminal devices such as transistors. While selector devices can be effective in reducing leakage currents when included in the cross-bar arrays, some selector devices, especially three-terminal devices such as transistors, can take up greater lateral foot print compared to the resistance switching element, thereby limiting the physical bit-density of the memory array. Achieving a high bit-density in memory technologies is technologically and economically desirable for practical implementations of resistive memory technologies.

Various 2-terminal structures such as diodes (e.g., Schottky diodes, Zener diodes or tunnel diodes) or volatile switches (e.g., threshold switches, Mott switches, MIEC access devices) have been proposed as selectors for unipolar and bipolar RRAMs. Semiconducting materials and/or novel materials are used to build such diodes. While selector elements could be introduced by means of transistors or rectifying diodes, which would block sneak currents in memory array, introducing such elements increases the size of the unit memory cell as well as the processing complexity. For instance, when using a select-transistor in a memory cell, an extra terminal is introduced, which makes the cell size increase above $4F^2$ (F-being the feature size) and also increases the complexity of the RRAM array fabrication, as well as its driving circuitry. Furthermore, the selector elements may not provide sufficient ON/OFF current ratios or sufficient suppression of leakage currents.

Therefore there is a need for highly-nonlinear self-rectifying RRAM cells that can, e.g., be implemented without a selector device, or be implemented with a selector device for further improvement in ON/OFF ratio and leakage currents.

SUMMARY OF CERTAIN INVENTIVE ASPECTS

It is an object of embodiments of the present disclosure to provide resistive switching memory cells which are non-linear, and self-rectifying and of a method of operating the same.

The above objective is accomplished by a method and device according to embodiments of the present disclosure.

In a first aspect, the present disclosure provides a resistive switching memory cell, the memory cell comprising a stack of a first electrode, a first inner region, a second inner region and a second electrode. The first inner region comprises one or more metal oxide layers, and the second inner region comprises only one or more insulating or semi-insulating layers, but no conductive layers, in particular no conductive layers with metallic character. With "metallic character" is meant "having a positive temperature coefficient", i.e. resistivity increases with temperature, in contrast to other conductive materials that have a negative temperature coefficient. The second inner region is in direct contact with the first inner region (meaning that there are no other layers in between) and can scavenge oxygen from the first inner region. The second inner region has a nonlinear charge carrier conduction dominant mechanism under an applied voltage or electric field. Due to the lack of any conductive layers, in particular conductive layers with metallic character, in the second inner region, the non-linearity of the second inner region is higher than in the case a metallic layer is added to the stack.

It is an advantage of embodiments of the present disclosure that the resistive switching memory cell can be placed between a word line and a bit line, with or without a selector element, e.g., a transistor or a rectifying diode, for operating the memory cell as part of an array which includes, e.g., thousands or millions of cells. The reason therefore is the self-rectifying behavior of resistive switching memory cells according to embodiments of the present disclosure. It is an advantage of embodiments of the present disclosure that basic CMOS compatible materials can be used. It is an advantage of embodiments of the present disclosure that resistive switching memory cells have an improved cycle-to-cycle and device-to-device uniformity compared to devices exhibiting filamentary switching. This may even hold for small cells such as 40 nm cells (area 40 nm×40 nm) or below. It is an advantage of embodiments of the present disclosure that the resistive switching memory cells have the ability to endure at least 1000 switching cycles while maintaining stable ON/OFF states. It is an advantage of embodiments of the present disclosure that forming of the resistive switching memory cell may or may not be needed. Embodiments of the present disclosure do not rely on filament forming to create an ON state. It is an advantage of embodiments of the present disclosure that a resistive memory cell can switch to an arbitrary-value off-state resistance, controllable by externally applying a suitable voltage. The switching process is controlled by the voltage applied between the first electrode and the second electrode. It is an advantage that the resistive switching memory cells according to embodiments of the present disclosure feature nonlinear current-voltage behavior in both low- and high-resistive states.

It is an advantage that resistive switching memory cells according to embodiments of the present disclosure may be implemented with or without an external compliance to control the switching process. Resistive switching memory cells according to embodiments of the present disclosure have low switching current levels, typically between 50 μA and 1 μA for a 40×40 $nm^2$ cell size, and reducing with decreasing cell area. In embodiments of the present disclosure the resistive switching memory cells can be read-out by applying a voltage of the same polarity as the voltage applied to reset the memory cell.

In a resistive switching memory cell according to embodiments of the present disclosure, the metal of the at least one metal oxide layer of the first inner region may be a transition metal. It is an advantage of embodiments of the present disclosure that transition metal oxides have weaker metal-oxygen bonds and therefore allow easier oxygen vacancy formation.

In a resistive switching memory cell according to embodiments of the present disclosure, the second inner region may comprise at least one amorphous, or predominantly amorphous layer. In such embodiments, there are less grain boundaries within the second inner region than in a polycrystalline structure. This implies less leaky current paths, as the presence of grain boundaries may give rise to leaky current paths. As these leaky current paths may compromise the device behavior it is an advantage that they are decreased. Furthermore, in case of a-Si, for example, amorphous nature leads to an increase in the bandgap and consequently barrier height, which is beneficial for current decrease and nonlinearity increase.

In a resistive switching memory cell according to embodiments of the present disclosure, the second inner region may contain at least one layer which is not intentionally doped. Doping may be performed using a higher thermal budget, which might be incompatible with BEOL limitations. Therefore it is an advantage of embodiments of the present disclosure that the thermal budget may be lowered by having a second inner region which contains at least one layer which is not intentionally doped. Moreover, it is an advantage of embodiments of the present disclosure that large fluctuations in the doping level of a layer can be avoided by having a layer which is not intentionally doped. Doping in small volumes can lead to severe device to device fluctuations. When for instance a layer of 10×10×10 $nm^3$ is considered, and a doping density of e.g., $1e18/cm^3$, this means that in that layer there has to be on the average 1 dopant atom. Changes in the number of dopant atoms therefore have an extreme impact on the device behavior. It is an advantage of embodiments of the present disclosure that this impact can be avoided or at least reduced by not intentionally doping at least one layer in the second inner region.

In a resistive switching memory cell according to embodiments of the present disclosure, at least one layer of the second inner region may be formed of Si, $SiGe_x$, $SiN_x$, $Al_2O_3$, MgO, AlN, $Si_3N_4$, $SiO_2$, $HfO_2$, $HfSiO_x$, $ZrO_2$, $ZrSiO_x$, $GdAlO_x$, $DyScO_x$, $Ta_2O_5$, each in stoichiometric or off-stoichiometric composition, or a combination thereof. It is an advantage of embodiments of the present disclosure that by adding a layer made of any of these materials the non-linearity of the current voltage characteristic is increased. Such a layer may for example have a thickness smaller than 2 nm, or even smaller than 1.5 nm, for example 1 nm. It is an advantage of embodiments of the present disclosure that by adding such a layer the non-linearity can be increased or even restored, while still allowing the O scavenging effect.

At least one layer of the second inner region may comprise or consist of Si, such that the Si, or Si-containing layer is in direct contact with the first inner region. Addition of a thin interlayer, other than Si-containing, between the Si or Si-containing layer of the second inner region and the first inner region may be advantageous for device operation: it may create a larger window, a lower operating current, etc. As a practical example, for instance a 1.5 nm or thinner $Al_2O_3$ layer may be provided as the top layer of the second inner region in direct contact with the first inner region. Addition of this thin interlayer may be particularly of interest when the barrier a-Si layer would go to below 4 nm thickness.

In a resistive switching memory cell according to embodiments of the present disclosure, at least one layer of the first inner region may be formed in stoichiometric or off-stoichiometric MgO, $Al_2O_3$, $TiO_2$, $HfO_2$, $ZrO_2$, $Ta_2O_5$, $TaO_2$, $Nb_2O_5$, $NbO_2$, $V_2O_5$, $VO_2$, or a combination thereof, and the first inner region may be doped with N, Mg, Al, Si, Ge, or a combination thereof.

In a resistive switching memory cell according to embodiments of the present disclosure, the first inner region has a thickness extending between a surface between the first inner region and the second inner region and a surface between the first inner region and one of the electrodes, wherein the thickness of the first inner region may be between 2 nm and 30 nm, preferably between 2 nm and 15 nm.

In a resistive switching memory cell according to embodiments of the present disclosure, the second inner region has a thickness extending between a surface between the first inner region and the second inner region and a surface between the second inner region and one of the electrodes, wherein the thickness of the second inner region may be between 2 nm and 30 nm, for instance between 4 and 20 nm, preferably between 2 nm and 15 nm. The thickness may be selected such that it is sufficient to make the IV characteristics of the device non-linear, and it may be dependent on the materials used.

In a resistive switching memory cell according to embodiments of the present disclosure, the first electrode and the second electrode may be formed by one or more layers, each layer comprising one or more metals or metallic compound layers, selected from Ti, Ta, Hf, W, Mo, Ru, Ir, Ni, Cu, Al, Mg, TiN, TaN, TiCN, TaCN, TiAlN, or from heavily p, or n-type doped semiconductor materials such as Si, Ge, GaAs, InGaAs or of a combination thereof.

In a second aspect, the present disclosure provides a method for manufacturing a resistive switching memory cell. The method comprises providing a stack of a first electrode, a first inner region, a second inner region and a second electrode, such that the first inner region comprises one or more metal oxide layers in contact with the second inner region, and the second inner region comprises only one or more insulating or semi-insulating but no conductive layers, in contact with the first inner region, wherein the insulating or semi-insulating layers can scavenge oxygen from the first inner region, and wherein the insulating ore semi-insulating layers have a nonlinear charge carrier transport behavior when a voltage or electric field is applied.

It is an advantage of embodiments of the present disclosure that a BEOL-compatible thermal budget is possible. It is an advantage of embodiments of the present disclosure that the electrode regions and the inner regions can be formed in materials that are compatible with CMOS technology.

A method according to embodiments of the present disclosure may comprise providing the first inner region and the second inner region in between the first electrode and the second electrode which are located in different substantially parallel planes such that the first electrode and the second electrode cross one another.

A method according to embodiments of the present disclosure may comprise providing the first inner region and the second inner region parallel with the first electrode.

A method according to embodiments of the present disclosure may comprise forming the first and second inner regions through a conformal coating process.

In a third aspect, the present disclosure provides a resistive switching memory cell according to embodiments of the first aspect, wherein the resistive switching memory cell is integrated in a cross-point array or in a vertical RRAM string.

It is an advantage of embodiments of the present disclosure that cross-point arrays or vertical RRAM strings can be realized that have a low thermal budget, a fast read/write access, a long time stability and a low voltage operation. The resistive switching memory cells according to embodiments of the present disclosure are self-rectifying. Therefore it is an advantage of embodiments of the present disclosure that extra elements such as transistors or rectifying diodes may not be needed to reduce the sneak currents in cross-point arrays of vertical RRAM strings made with these resistive memory cells. Thereby the complexity (in case of a transistor an extra terminal is present), the power dissipation, and the size can be reduced.

In a further aspect the present disclosure provides a method for operating a resistive switching memory cell (100) according to embodiments of the first aspect of the present disclosure. The method comprises a writing step comprising a reset step wherein a first positive voltage is applied on the first electrode for bringing the resistive switching memory cell to a high resistive state, or a set step wherein a negative voltage is applied on the first electrode for bringing the cell to a low resistive state, and a read-out step wherein a second positive voltage is applied to the first electrode for reading out the resistive state of the cell, wherein the second positive voltage is smaller than the first positive voltage.

It is an advantage of embodiments of the present disclosure that for the reset step a continuous range of positive voltages can be applied. The read-out voltage (the second positive voltage) should be below the voltage used at the reset step (the first positive voltage). It is an advantage of embodiments of the present disclosure that no forming step may not be needed for operation.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
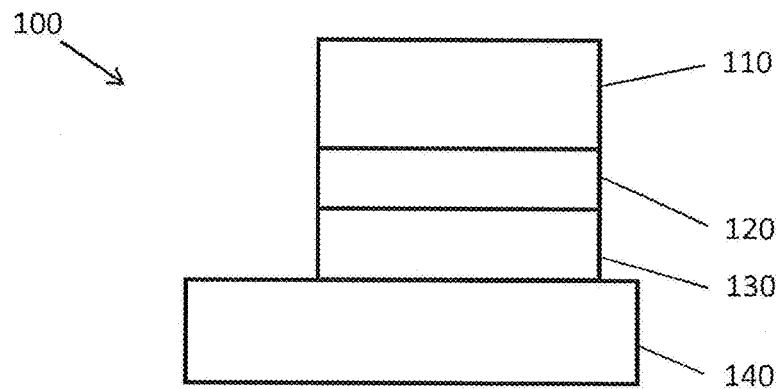
FIG. 1 shows a schematic cross-section of a resistive switching memory cell according to an embodiment of the present disclosure.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In the context of the present disclosure, an RRAM device is a type of non-volatile random access memory device that operates by reversibly changing the resistance across a solid-state material or combination of materials.

In the context of the present disclosure, a vacancy is a type of point defect in a crystalline, polycrystalline or amorphous lattice, in which an atom, such as an oxygen atom, is missing from one of the lattice sites.

In the context of the present disclosure, a high resistive state corresponds with an OFF-state and a low resistive state corresponds with an ON-state.

In the context of the present disclosure, the Gibbs free energy of a vacancy is defined as the standard free energy associated with (absorbed or released), forming a vacancy in a material or a material system, in accordance with specific chemical or redox reactions.

Figure 2:
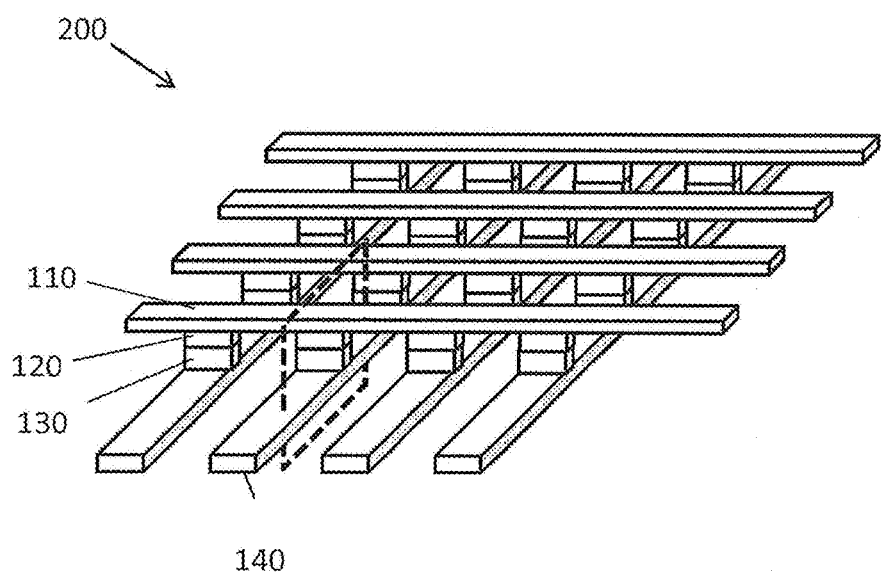
FIG. 2 shows a resistive switching memory cell integrated in a cross-point array in accordance with embodiments of the present disclosure.

In a first aspect, the present disclosure relates to a resistive switching memory cell 100, an example whereof is schematically illustrated in FIG. 1. FIG. 1 shows the cross-section of a resistive memory cell which may be integrated in a cross-point array. An example of such cross-point array is illustrated in FIG. 2. Elements like word line drivers, bit line drivers, controllers etc. are not illustrated in the drawing and are not described here in more detail, as they are standard and known to a person skilled in the art. The dotted lines in FIG. 2 show the cross-section which is depicted in FIG. 1. The resistive switching memory cell 100 comprises a stack of a first inner region 120, and a second inner region 130, in between a first electrode 110 and a second electrode 140. These are all shown in the exemplary embodiments of the present disclosure illustrated in FIG. 1 and FIG. 2.

The first electrode 110, which may also be referred to herein as top electrode (TE), may be made from a conductive material layer, such as metals or metallic compounds, for instance a transition metal e.g., Ru, W, or a transition metal nitride, e.g., TiN, TaN. Preferably the conductive material layer is compatible with standard CMOS processes. It will be appreciated that the material of the top electrode can influence the ON-OFF levels of the resistive switching memory cell 100. Without being bound to any theory, the first electrode 110 may form a Schottky barrier with the first inner region 120 underneath it. In this regard, in some embodiments, the top electrode has a work function of midgap to p-type. As described herein, a work function of a metal may be described in relation to a silicon band gap. Thus, a metal having a mid-gap work function has an energy level near the mid-point of the silicon band gap, e.g., within about 0.3 eV or less thereof, a metal having a p-type work function has an energy level closer to the valence band energy level of silicon than to the conduction band energy level, e.g., within about 0.3 eV of the valence band energy, and a metal having an n-type work function has an energy level closer to the conduction band energy level of silicon than to the valence band energy level, e.g., within about 0.3 eV of the conduction band energy. By choosing, for the first electrode 110, a different material with a higher work function, the Schottky barrier height between the top electrode and the neighboring layer can be increased, and thus current levels can be decreased.

In the embodiment illustrated in FIG. 1, the first inner region 120 is provided adjacent the first electrode 110, but the disclosure is not limited thereto. In alternative embodiments (not illustrated) the location of the first inner region 120 and second inner region 130 can be inversed with respect to the top and bottom electrodes 110, 140.

The first inner region 120 serves as a switching layer and may for instance be a titanium dioxide layer ($TiO_2$). The material of the first inner region 120 may be a metal oxide or a transition metal oxide, which preferably easily forms oxygen vacancies by deposition or under thermal treatment, i.e. when the Gibbs free energy of oxygen vacancy formation under such conditions becomes negative. According to embodiments, the first inner region comprises a metal oxide or a transition metal oxide selected from the group consisting of $MgO_x$, $AlO_x$, $TiO_x$, $HfO_x$, $ZrO_x$, $TaO_x$, $NbO_x$, $VO_x$, $ScO_x$, $LaO_x$ and combinations thereof. The metal oxide or the transition metal oxide can be stoichiometric or sub-stoichiometric. For example, when the metal oxide or the transition metal oxide is stoichiometric, the metal oxides or the transition metal oxide may be selected from the following list: $Ta_2O_5$, $Nb_2O_5$, $HfO_2$, $ZrO_2$, $V_2O_5$, MgO, $Al_2O_3$, $Gd_2O_3$, $Sc_2O_3$, $La_2O_3$, or a combination of materials thereof. This list is non-exhaustive. Also a deviation from the stoichiometry is possible. It is also possible that the first inner region 120 comprises oxides with metals having different oxidation states, such as $Ta_2O_5$ and $TaO_2$, $Nb_2O_5$ and $NbO_2$ or $V2O_5$ and $VO_2$. The first inner region 120 may comprise a stack of multiple layers. For instance, the first inner region 120 may comprise a $TiO_2$ layer with on top thereof a modified insulating (semiconductive) interface with the first electrode 110 by insertion of one or more insulating/semiconductive layers or by purpose modifying the material by doping or chemical/thermal treatments, such as for example nitridation and anneals, so as to suitably adjust its physical-chemical properties and morphology. In embodiments of the present disclosure the thickness of the first inner region 120 may be between 2 and 25 nm, such as between 3 and 20 nm, for instance about 8 nm.

The second inner region 130 is provided in between the first inner region 120 and the second electrode 140. The second inner region 130 is able to fulfill a double role: that of an nonlinear electron transport barrier, which modulates the RRAM cell conductivity in both low and high resistance states and, at the same time, that of an oxygen scavenger, able to induce an oxygen vacancy reservoir in the first inner region 120, where switching between the two memory states takes place. The reservoir is thereby large enough such that it cannot be emptied by processing or electrical manipulation.

According to embodiments, the second inner region 130 comprises one or more layers having a stoichiometric or off-stoichiometric composition of a material selected from the group consisting of Si, $SiGe_x$, $SiN_x$, $AlO_x$, $MgO_x$, $AlN_x$, $SiN_x$, $HfO_x$, $HfSiO_x$, $ZrO_x$, $ZrSiO_x$, $GdAlO_x$, $DyScO_x$, $TaO_x$ and combinations thereof. The one or more layers may be stoichiometric or sub-stoichiometric. For example, the one or more layers of the second inner region 130 may include a stoichiometric material selected from the group consisting of Si, SiGe, $Si_3N_4$, $Al_2O_3$, MgO, AlN, $Si_3N_4$, $HfO_2$, $HfSiO_2$, $ZrO_2$, $ZrSiO_2$, $GdAlO_3$, $DyScO_3$, $TaO_2$ or $Ta_2O_5$.

In some embodiments of present disclosure, the second inner region 130 is amorphous and is not intentionally doped, e.g., with an n-type dopant which increases the electron concentration of the second inner region or a p-type dopant which increases the hole concentration of the second inner region. The second inner region 130 may be an amorphous silicon (a-Si, which may have a higher bandgap than crystalline silicon) layer or any other layer, e.g., Si-containing layer (for instance comprising $SiN_x$, or transition metal oxides) that can scavenge oxygen from the first inner region 120. The second inner region 130 may also be a SiGe alloy which can scavenge oxygen from the first inner region 120. Preferably the SiGe alloy is not doped. The second inner region 130 may comprise multiple materials. These materials may be organized in layers or as an alloy. In embodiments of the present disclosure the second inner region may comprise an $Al_2O_3$/a-Si layer. In embodiments of the present disclosure the thickness of the second inner region 130 is such that a barrier exists which makes the behavior of the resistive switching memory cell 100 non-linear. The thickness of the second inner region 130 may be between 2 and 25 nm, for instance between 4 and 20 nm, such as e.g., about 8 nm. The second inner region 130 should have a thickness which is sufficient to make the IV characteristics of the device non-linear. In an exemplary embodiment of the present disclosure the second inner region may have a thickness $t_1$. The electron barrier height between the second electrode 140 and the inner region 130 may be $B_1$. In this example the material of the second inner region 130 could be replaced by another material, comprising only insulating or semi-insulating layers, but no conductive layers, that can scavenge oxygen from the first inner region (120), wherein the new material has a thickness $t_2=t_1*(B_1/B_2)^{3/2}$, where $B_2$ is the electron barrier height between second electrode 140 and the inner region 130, implemented by the other material.

The second electrode 140 adjacent the second inner region 130, also referred to as bottom electrode (BE), may be made from a conductive material layer, such as a transition metal e.g., Ru, W, Ti, Ta, or a transition metal nitride, e.g., TiN, TaN. The first electrode 110 and second electrode 140 may be implemented in same, similar or different materials. The number of layers in first 110 and second electrode 140 may be the same or different. The second electrode 140 may be, for instance, a titanium nitride layer (TiN). The second electrode may form a Schottky barrier with the second inner region.

Resistive switching memory cells according to embodiments of the present disclosure provide a stable switching. The set current and the reset current are dependent on the area of the resistive switching memory cell. For example: a resistive switching memory cell with a size of 40 nm, e.g., 40×40 nm² in area, may have a reset current of between 10 and 30 µA, for instance about 20 µA. This reset current can be controlled by process modification, such as nitridation or thermal treatment, or by appropriate design of the cell, for example suitable choice of the layer thickness or the inner regions. The set current may be a few µA, for example 1-5 µA.

In embodiments of the present disclosure the ratio between the read-out current in the ON state and the read-out current in the OFF state may be bigger than 20. In an exemplary embodiment the read-out current in the ON state is 1 µA and the read-out current in the OFF state is 50 nA. This corresponds with a resistance in the ON state of 3 MΩ and a resistance in the OFF state of 60 MΩ. Hence in this exemplary embodiment an on/off window of 20 can be obtained. In embodiments of the present disclosure the on/off window may be between 1 and 1000, for example between 3 and 100.

In embodiments of the present disclosure the resistive switching memory cell may be operated at 5V DC or in pulse mode with pulse widths of 1 ms or shorter, preferably µs, or shorter than that, for example 100 ns or even shorter than 10 ns. Shorter pulse widths may, however, may be accompanied by an increased voltage.

In particular embodiments of the present disclosure the resistive switching memory cell 100 may comprise: a first electrode 110 made of TiN, a first inner region 120 comprising a layer of $Al_2O_3$, a second inner region 130 comprising a layer of a-Si, a layer of $TiO_2$ and a layer of $Al_2O_3$, a second electrode 140 made of TiN.

Thus in this particular example, the following cell 100 is obtained: $TiN/Al_2O_3/a-Si/TiO_2/Al_2O_3/TiN$.

Figure 11:
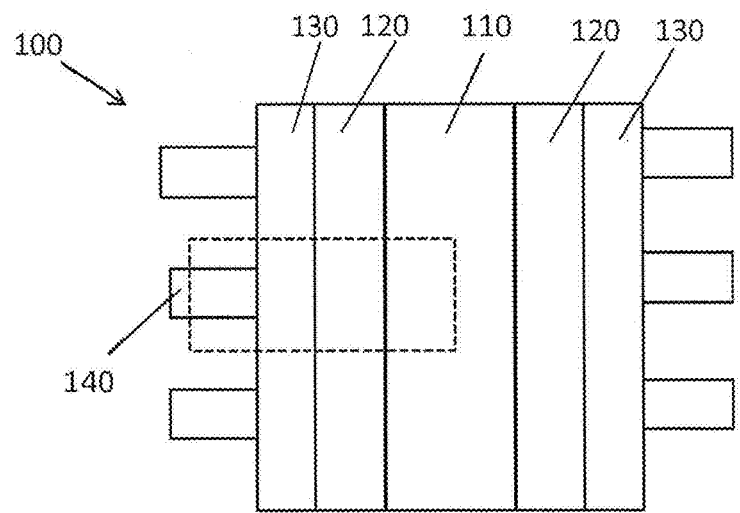
FIG. 11 shows a schematic cross-section of a resistive switching memory cell from a vertical RRAM string, in accordance with embodiments of the present disclosure.

In embodiments of the present disclosure, switching memory cells 100 may be organized in a cross-point array as illustrated in FIG. 2, where each memory cell 100 is designed in a horizontal stack of layers. Alternatively, as illustrated in FIG. 11, a switching memory cell 100 may be configured in a vertical RRAM string, where each cell 100 is designed in a stack of vertical layers.

Figure 12:
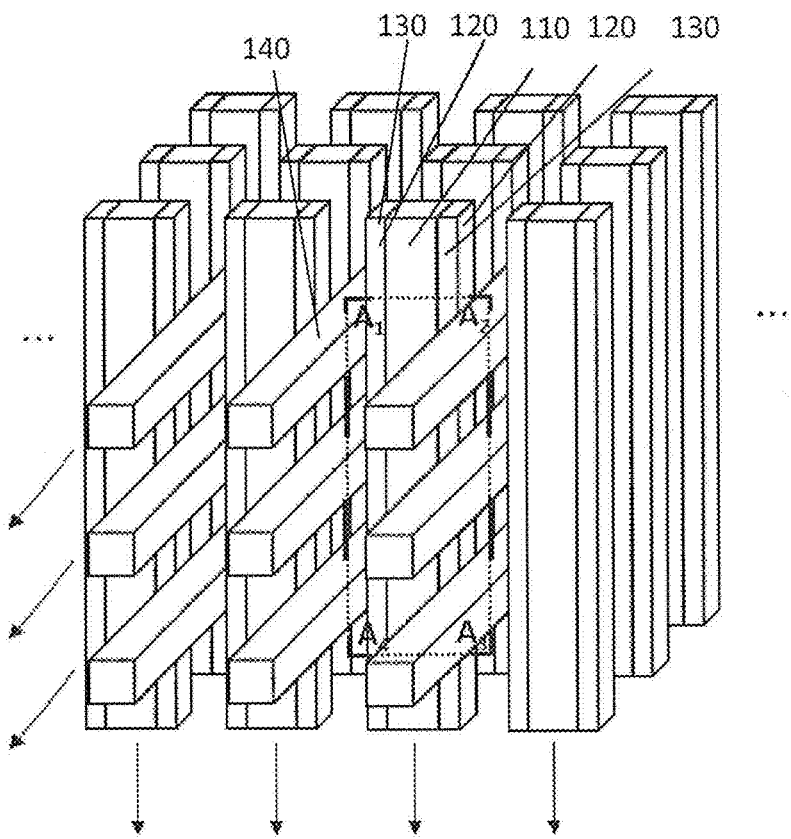
FIG. 12 shows resistive memory cells integrated in vertical RRAM strings in accordance with embodiments of the present disclosure.

FIG. 12 shows a 3D-view of resistive switching memory cells integrated in vertical RRAM strings in accordance with embodiments of the present disclosure. The $A_1A_2A_3A_4$ cross-section of this figure is shown in FIG. 11. FIG. 12 shows a first inner region 120, a second inner region 130 against a first electrode 110 against a second inner region 130, against a first inner region 120. In FIG. 12 the first inner region and second inner region are drawn as one layer, for ease of drawing only. The detail of FIG. 11 shows the different layers 120, 130. In the exemplary embodiment of FIG. 12 the first electrode 110, the first inner region 120 and the second inner region 130 are organized in vertical layers. In the exemplary embodiment, the first electrode 110, the first inner region 120 and the second inner region 130 are vertical bars. The first inner region 120 and the second inner region 130 are thereby parallel with the first electrode 110. The second electrodes in FIG. 12 are oriented orthogonal to the first inner region 120. In the exemplary embodiment of FIG. 12 the second electrodes 140 are in contact with the first inner regions 120.

In a second aspect, the present disclosure relates to a method for manufacturing a resistive switching memory cell according to embodiments of the first aspect of the present disclosure. The method comprises providing a bottom electrode (second electrode) 140, on top thereof providing a second inner region 130, on top thereof providing a first inner region 120 and on top thereof providing a first electrode, also called top electrode 110. The first electrode 110 thereby forms a Schottky barrier with the first inner region 120. The first inner region 120 comprises a metal oxide or a transition metal oxide that can easily form oxygen vacancies, and the second inner region 130 comprises an optionally amorphous, not intentionally doped insulating or semi-insulating layer which can scavenge oxygen from the first inner region 120 and which exceeds a minimal thickness such that the IV behavior of the memory cell becomes non-linear.

In embodiments of the present disclosure the second inner region may be deposited using a conformal coating method, such as e.g., chemical vapor deposition (CVD) or atomic layer deposition (ALD), or using a non-conformal coating method, such as e.g., physical vapor deposition (PVD). Other deposition methods are for example metal oxide chemical vapor deposition (MOCVD), pulsed laser deposition (PLD). It is an advantage that resistive switching memory cells 100 which are fabricated using a conformal coating method can be fabricated in a vertical array.

In embodiments of the present disclosure oxygen vacancies are induced into the first inner region 120 by annealing. Alternatively the oxygen vacancies can be created during deposition, through a variety of techniques, such as but not limited to physical vapor deposition, plasma treatments, and other techniques, which allow sputtering materials with off-stoichiometric composition.

A post-deposition anneal (PDA) step may be carried out after deposition of the first inner region 120 and before provision of the first electrode layer 110. This anneal step may be used for preparing the cell 100 in a pre-defined state (ON/OFF) or for adjusting the switching current levels. The PDA condition in relation to stack design determines whether the cell 100 is initially ON or initially OFF. For example in a resistive switching memory cell 100 comprising a stack of a first electrode 110 on top of a first inner region 120, on top of a second inner region 130, on top of a second electrode 140, annealing can induce more defects (vacancies) in the stack. These defects may be induced in a sub-region of the first inner region 120 (e.g. at the interface with the second inner region 130), or they may extend throughout the first inner region 120. Depending on the film thickness this may produce a memory cell which initially is either in the OFF or in the ON state. Furthermore, the density of generated vacancies may raise or reduce the switching current—exemplified as 20 µA earlier, or of the ON/OFF states, exemplified as 3 MOhm and 60 MOhm earlier.

In a third aspect, the present disclosure relates to the use of a resistive switching memory cell 100 according to embodiments of the first aspect in a cross-point array or in a vertical RRAM string. It is an advantage of embodiments of the present disclosure that the resistive switching memory cells 100 are self-rectifying switching memory cells for which a selector may not be needed. These resistive switching memory cells 100 can fit into a pitch size cross-point array or in a vertical RRAM string.

In a fourth aspect, the present disclosure relates to a method for operating a resistive switching memory cell 100 according to aspects of the first embodiment of the present disclosure. The method comprises writing steps during which a value, represented by a high resistive (OFF-state) or a low resistive cell state (ON-state), is written into the cell, and readout steps, during which the value, represented by the high resistive or a low resistive cell state, is read out from the cell. A writing step comprises either one of a reset step wherein a first positive voltage is applied between the first electrode 110 (the top electrode) and the second electrode 140 (the bottom electrode), for example the second electrode 140 may be grounded and a positive voltage may be applied to the first electrode 110, for bringing the resistive switching memory cell to a high resistive state, or a set step wherein a negative voltage is applied between the first electrode 110 (the top electrode) and the second electrode 140 (the bottom electrode), for example the second electrode 140 may be grounded and a negative voltage may be applied to the first electrode 110 for bringing the cell to a low resistive state.

During the read-out step a second positive voltage is applied between the first electrode 110 (the top electrode) and the second electrode 140 (the bottom electrode), for example the second electrode 140 may be grounded and a positive voltage may be applied to the first electrode 110 (the top electrode) for reading out the resistive state of the cell, wherein the second positive voltage is smaller than the first positive voltage.

Figure 3:
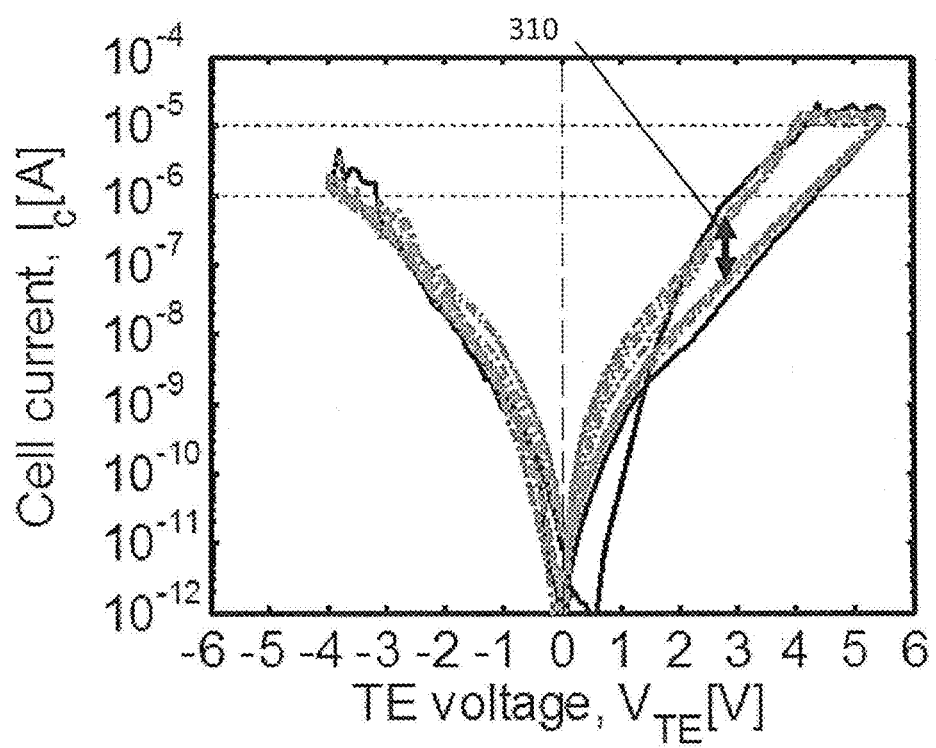
FIG. 3 shows the current-voltage characteristic of a 40 nm size (meaning device area W×L=40 nm×40 nm) resistive switching memory cell according to an embodiment of the present disclosure.

In the embodiment illustrated in FIG. 3, initially, i.e. after processing the resistive switching memory cell 100, the resistive switching memory cell 100 is in the ON-state (low resistive state).

The ratio between the OFF-state resistance and the ON-state resistance defines the ON/OFF window. The ON/OFF window is typical for a particular stack and can be derived from the IV sweeps. In embodiments of the present disclosure the pulsed Set or Reset voltage is higher than the DC Set or Reset voltage. For each decade the pulses are shortened, the Set or Reset voltage increases with a predetermined delta value. The Set or Reset voltage is depending on the stack (first electrode, first inner region, second inner region, second electrode) and on the stack materials of the resistive switching memory cell. The Set or Reset voltage is also depending on the Set and Reset operation. In an exemplary embodiment of the present disclosure the Reset voltage is 5.5 V in DC. In this example the trade-off between the voltage and pulse length is 0.2 V/decade. In embodiments of the present disclosure DC corresponds with a pulse length of 1 ms. For pulses longer than 1 ms there is no difference in Set and Reset voltages. In this example the Reset voltage for a 1 μs pulse is therefore about 5.5 V+3 decades*(0.2 V/decade) which is equal to 6.1 V. For a pulse length of 100 ns the Reset voltage becomes 6.3 V. A similar reasoning can be maintained for a Set pulse.

First a reset step is applied. The voltage of the reset step is depending on the stack structure and on the process (e.g., annealing). The voltage is moreover depending on the applied pulse width. In an exemplary embodiment of the present disclosure the voltage of the reset step may be between 7 Volt and S.S. V for a pulse width of the reset pulses between 1 ms and 10 ns. In the same exemplary embodiment the voltage during a subsequent set step is reduced down to −4 V for pulse widths between 1 ms and 10 ns.

By changing the voltage difference between the first electrode 110 (the top electrode) and the second electrode 140 (the bottom electrode) the oxygen vacancy distribution in the first inner region 120 and the second inner region 130 can be modified.

In the following, current-voltage measurements of resistive memory cells according to embodiments are described. Figures of merit for the performance of RRAM devices include the current and the non-linearity factor during write and read operations. For example, to program and erase some resistive switching devices, relatively low current or current density may be desirable, e.g., less than 100 μA or less than 10 MA/cm$^2$. In addition, it may be desirable to have the non-linearity factor (or rectification factor or on/off ratio), which can be defined as a ratio between the current thorough the memory device at a switching voltage and the current through the memory at half the switching voltage, exceed, e.g., 100 or 1000, for example, to enable relatively large memory arrays, e.g., memory arrays exceeding 10,000 bit or 1 Mbit in size, respectively. As illustrated below, advantageously, resistive switching memory devices according to embodiments provide these figures or merit.

FIG. 3 shows the current through a resistive switching memory cell 100 versus the applied voltage difference between the top electrode 110 of and the bottom electrode 140 of the resistive switching memory cell. In the illustrated example, the applied voltage on the top electrode 110 is relative to the bottom electrode 140 that is grounded. The vertical axis shows the current through the cell, expressed in Ampere. The horizontal axis shows the voltage applied to the cell, expressed in Volt. The resistive switching memory cell 100 in this example has a feature size of 40 nm (i.e. an area of 40*40 nm$^2$). The figure shows a number of consecutive, alternating Set/Reset sweeps whereby the shown data is raw data. The reset current is obtained by applying a voltage with positive polarity, the set current is obtained by applying a voltage with negative polarity on the top electrode, while grounding the bottom electrode. This example is given for 40 nm cells; however, the present disclosure is not limited thereto. Smaller sized resistive switching memory cells 100 are also possible.

In embodiments of the present disclosure the set as well as the reset current voltage (IV) characteristics are continuous for any cell size and do not exhibit sharp transitions (as for example shown in the IV characteristic of FIG. 3), which are typically indicative of filamentary switching.

Figure 10:
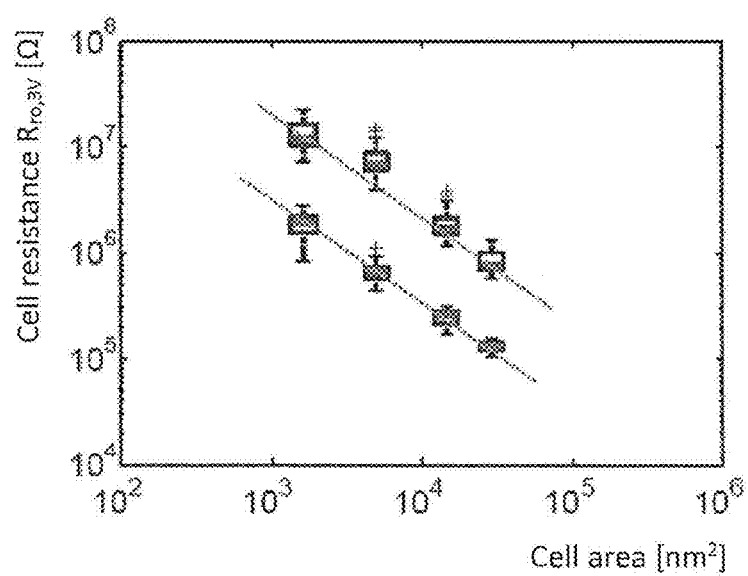
FIG. 10 shows the on/off resistances in function of the cell size of resistive switching memory cells in accordance with embodiments of the present disclosure.

In embodiments of the present disclosure, the switching currents during the writing (set or reset) operations, as well as during the read operations, depend on the cell size, and more specifically on the cell area, with a slope of 1:1 (as shown for example in FIG. 10). This behavior is caused by a switching mechanism and cell state which involve the whole or most of the cell cross-section area and is not localized in a particular cell region. The latter is typical for resistive memory cells where conductive filaments are formed.

In embodiments of the present disclosure, a forming operation may not be needed prior to operation as shown in FIG. 3. As described herein, forming refers to a process whereby a memory cell is initiated for subsequent usage and may include, e.g., biasing the memory cell under a voltage or a current that is substantially higher than subsequent operating voltages or currents. In the illustrated embodiment, there is appreciable difference in current-voltage (IV) behavior for IV sweeps subsequent to an initial sweep, particularly at higher sweep voltages (e.g., >about 3V in FIG. 3). In prior art resistive memory cells filaments are formed at higher voltages whereas the present disclosure does not rely on filament forming.

In embodiments of the present disclosure, the operation of the resistive switching memory cell (e.g., switching voltage and/or current) is relatively independent of the forming voltage. An example thereof is illustrated in FIG. 3 showing a different first IV trace at low biases.

Figure 4:
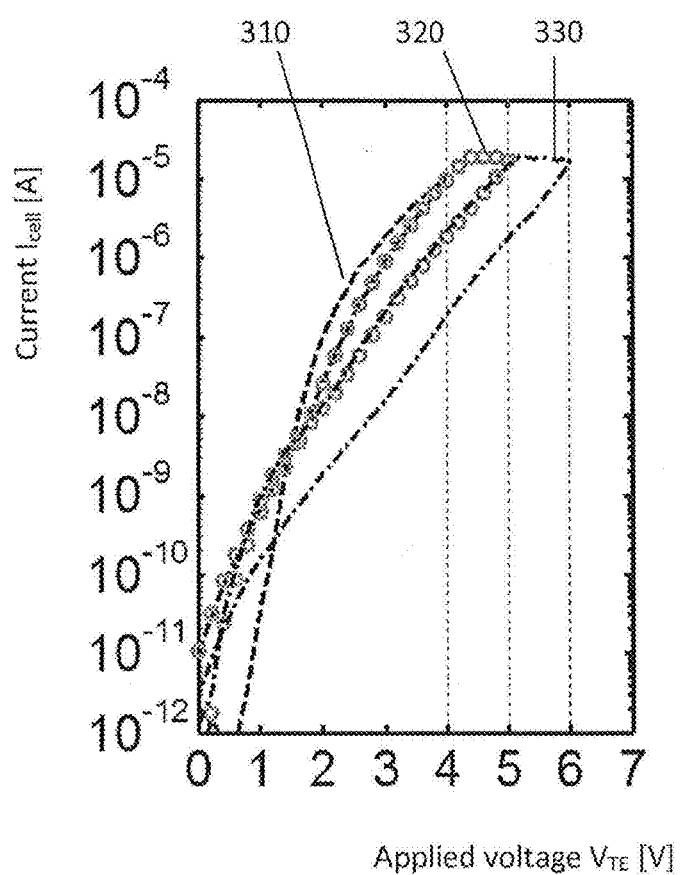
FIG. 4 shows the analog behavior of a resistive switching memory cell according to an embodiment of the present disclosure.

FIG. 4 shows three different current voltage (IV) characteristics of a resistive switching memory cell 100 in accordance with embodiments of the present disclosure. The vertical axis shows the current expressed in Ampere. The horizontal axis shows the voltage expressed in Volt. Each of the reset IV characteristics has a different stop voltage, i.e. a voltage where the up going voltage sweep ends and starts to decrease again. Only the parts of the IV characteristics having a positive voltage polarity are shown. For graph 310, the stop voltage equals 4V, for graph 320 the stop voltage equals 5V and for graph 330 the stop voltage equals 6V. The downward part of the most left graph 310 fully overlaps with the upward part of the middle graph 320. Also the downward part of the middle graph 320 fully overlaps with the upward part of the most right graph 330. The reset state is thus continuously controllable by the stop voltage. A similar control is achievable for the set state. It is thus an advantage that resistive switching memory cells 100 according to embodiments of the present disclosure have an analog switching behavior. It is an advantage of embodiments of the present disclosure that multiple off states can be obtained for a resistive switching memory cell. This allows to use the resistive switching memory cells in a multi-level cell (MLC) configuration. The measurements in FIG. 4 are done on a 40 nm memory cell. The analog switching behavior moreover has as advantage that the resistive switching memory cell 100 according to embodiments of the present disclosure may be used for implementing electronic synapses for neuromorphic computing circuits/chips.

The reset voltage of the 40 nm resistive switching memory cell, of which the IV characteristic is illustrated in FIG. 3, goes up to 5.5 V in DC. The set voltage goes down to −4V in DC. Read-out of the current may for example be done at 3 V as shown by the double arrow 310 in FIG. 3. In the exemplary 40 nm embodiment, which is not intended to be limiting for the present disclosure, this leads to a current of around 1 μA when the resistive switching memory cell is in the ON state and to about 50 nA when the resistive switching memory cell is in the OFF state. The non-linearity is around 100 when it is defined as the ratio of the current at the maximum reset voltage and the current at half of the maximum reset voltage and around 500 when it is defined as the ratio of the current at the maximum reset voltage and the current at a third of the maximum reset voltage.

Figure 5:
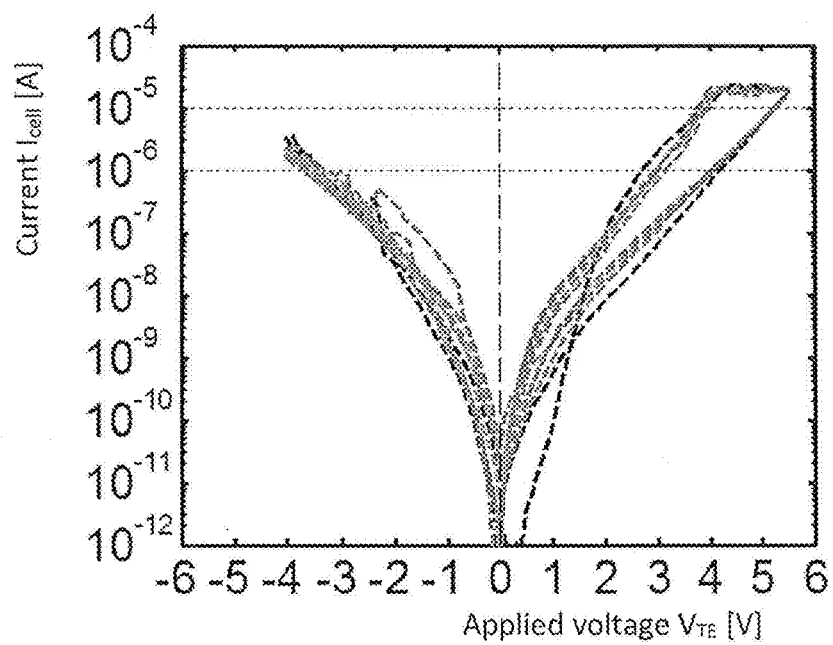
FIG. 5 shows the current voltage characteristic of a 50 nm size resistive switching memory cell according to an embodiment of the present disclosure.

The switching currents increase with increasing size of the resistive switching memory cell. This is illustrated by comparison of FIG. 3, and FIG. 5. The vertical axis of FIG. 3, and FIG. 5 shows the current expressed in Ampere. The horizontal axis shows the voltage expressed in Volt. FIG. 3 shows the raw IV data of a number of sweeps for a resistive switching memory cell with a size of 40 nm. FIG. 5 shows a graph measured on a resistive switching memory cell 100 with a size of 50 nm. The graphs of FIG. 3, and FIG. 5 show multiple sweeps thereby illustrating the cycle-to-cycle uniformity of the resistive switching memory cells.

Figure 6:
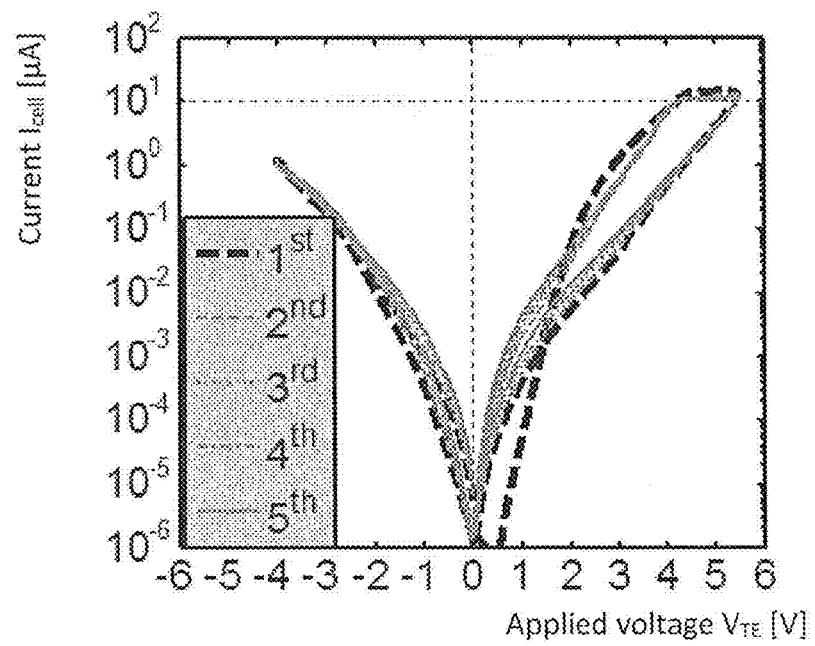
FIG. 6 shows the raw current voltage data of a sequence of 5 sweeps on a 40 nm size resistive switching memory cell according to an embodiment of the present disclosure. It shows averaged IV sweeps for 5 consecutive DC set/reset cycles, over a plurality of devices tested, and is illustrative for cycle-to-cycle uniformity.
Figure 7:
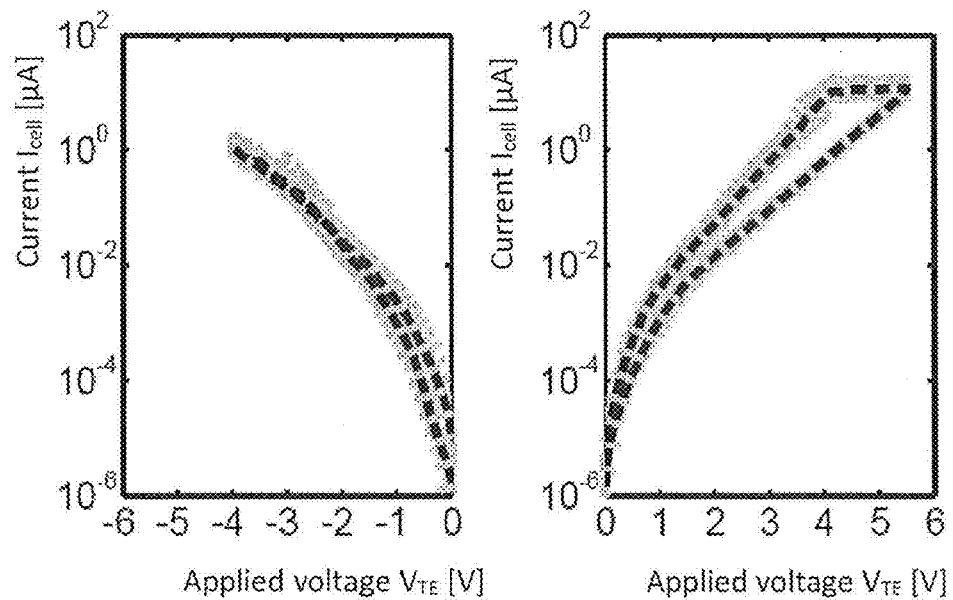
FIG. 7 shows the raw current-voltage data on a plurality of 40 nm resistive switching memory cells according to an embodiment of the present disclosure. It shows raw and averaged data for a particular set or reset sweep and is illustrative for device-to-device uniformity.
Figure 8:
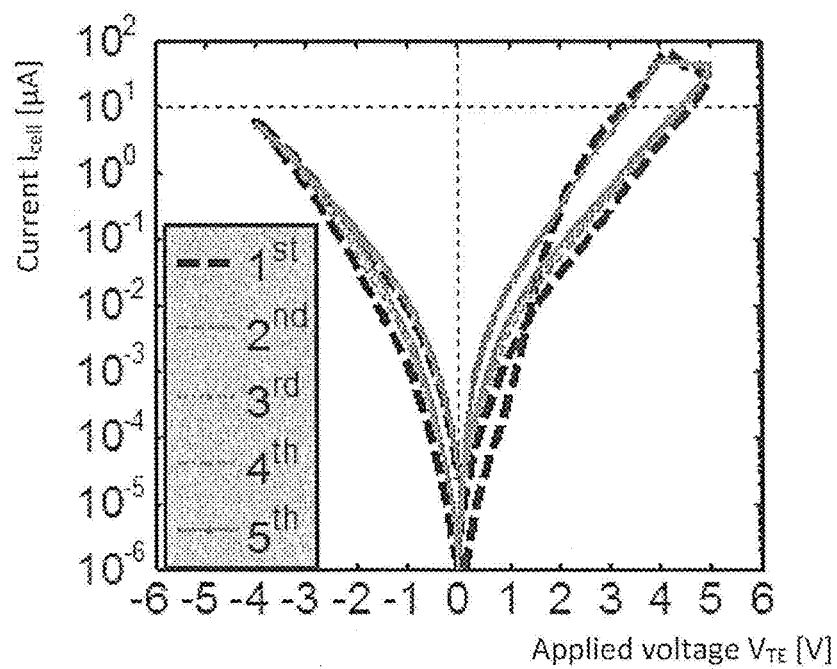
FIG. 8 shows the raw current voltage data of a sequence of 5 sweeps on a 120 nm size resistive switching memory cell according to an embodiment of the present disclosure. It shows averaged IV sweeps for 5 consecutive DC set/reset cycles, over a plurality of devices tested, and is illustrative for cycle-to-cycle uniformity.
Figure 9:
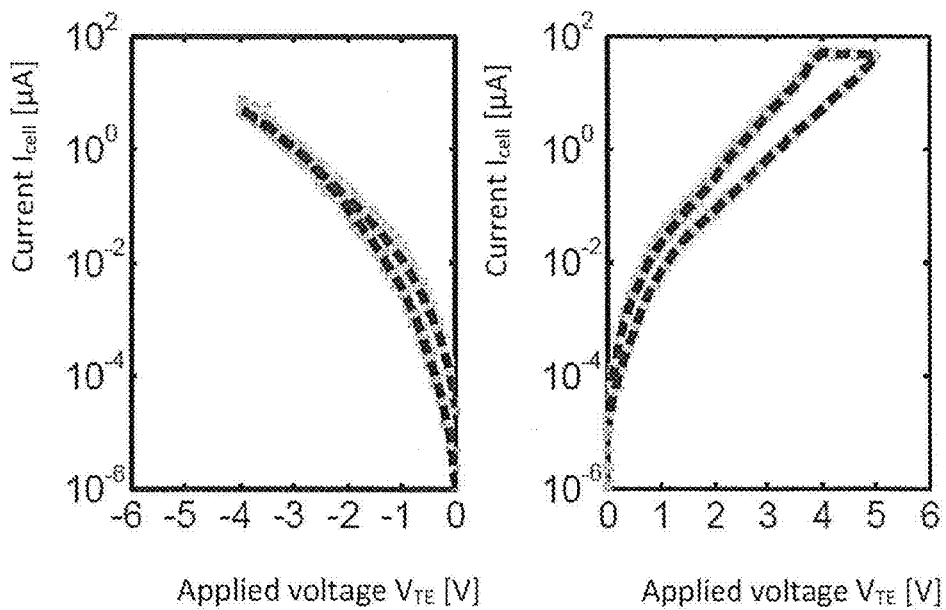
FIG. 9 shows the raw current voltage data on a plurality of 120 nm resistive switching memory cells according to an embodiment of the present disclosure. It shows raw and averaged data for a particular set or reset sweep and is illustrative for device-to-device uniformity.

FIG. 7 and FIG. 9 show raw and averaged data for a particular set or reset sweep and are illustrative for the device-to-device uniformity. It is therefore an advantage of embodiments of the present disclosure that a uniform device to device behavior can be realized. FIG. 6, and FIG. 8 are averaged IV sweeps for 5 consecutive DC set/reset cycles, over a plurality of devices tested and are illustrative for the cycle-to-cycle uniformity.

For FIG. 8 and FIG. 9 the resistive switching memory cells 100 had a size of 120 nm. The vertical axis in FIG. 6-FIG. 9 represents the current through the switching memory cell 100 and is expressed in μA, the horizontal axis represents the voltage over the switching memory cell 100 and is expressed in V.

In embodiments of the present disclosure resistive switching memory cells have cell sizes with features below 200 nm, preferably below 50 nm, for instance between 5 nm and 40 nm, such as between 5 nm and 20 nm. As can be seen from FIG. 6 to FIG. 9 the cell currents increase with the device size.

As illustrated in FIG. 10, also on/off resistances scale with cell area: the smaller the cell size the higher the resistances. FIG. 10 shows the cell resistance (in SI, in the particular embodiment illustrated measured at 3 V) in function of the cell area (in $nm^2$). The cell resistance is shown for cells in the OFF state (highest graph) as well as for cells in the ON state (lowest graph). It can be seen that both the ON and the OFF state resistances scale with the cell area in a 1:1 ratio. The graph illustrates a clear separation between the resistance values in the OFF state and the resistance values in the ON state.

The foregoing description details certain embodiments of the invention. It will be appreciated, however, that no matter how detailed the foregoing appears in text, the invention may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

What is claimed is:

1. A resistive switching memory device, comprising:
a first electrode and a second electrode having interposed therebetween a first inner region and a second inner region, the first and second inner regions contacting each other;
the first inner region comprises one or more metal oxide layers; and
the second inner region comprises of a plurality of layers, each of the layers being an insulating, a semi-insulating or a semiconducting layer,
wherein the second inner region comprises one or more layers having a stoichiometric or off-stoichiometric composition of a material selected from the group consisting of $SiGe_x$, $AlO_x$, $MgO_x$, $AlN_x$, $SiN_x$, $HfO_x$, $HfSiO_x$, $ZrO_x$, $ZrSiO_x$, $GdAlO_x$, $DyScO_x$, $TaO_x$ and combinations thereof,
wherein the second inner region comprises one or more silicon-containing layers that contact the first inner region,
wherein the second inner region is configured to scavenge oxygen from the first inner region, wherein the second inner region has a nonlinear charge carrier conduction mechanism that is dominant under an applied voltage or electric field, and wherein the first electrode contacts one of the first inner region or the second inner region, and wherein the second electrode contacts the other of the first inner region or the second inner region.

2. The resistive switching memory device according to claim 1, wherein at least one of metals of the one or more metal oxide layers is a transition metal.

3. The resistive switching memory device according to claim 1, wherein the second inner region comprises at least one amorphous or predominantly amorphous layer.

4. The resistive switching memory device according claim 1, wherein the second inner region contains at least one layer that is not intentionally doped.

5. The resistive switching memory device according to claim 1, wherein the first inner region comprises one or more layers having a stoichiometric or off-stoichiometric composition of a material selected from the group consisting of $MgO_x$, $AlO_x$, $TiO_x$, $HfO_x$, $ZrO_x$, $TaO_x$, $NbO_x$, $VO_x$ and combinations thereof.

6. The resistive switching memory device according to claim 1, wherein the first inner region is doped with N, Mg, Al, Si, Ge, or a combination thereof.

7. The resistive switching memory device according to claim 1, wherein the first inner region has a thickness between 2 nm and 30 nm.

8. The resistive switching memory device according to claim 1, wherein the second inner region has a thickness between 2 nm and 30 nm.

9. The resistive switching memory device according to claim 1, wherein each of the first electrode and the second electrode comprises one or more layers, wherein each of the one or more layers comprises one or more metals or metallic compounds selected from the group consisting of Ti, Ta, Hf, W, Mo, Ru, Ir, Ni, Cu, Al, Mg, TiN, TaN, TiCN, TaCN, TiAlN, a heavily doped semiconductor material and combinations thereof.

10. The resistive switching memory device according to claim 1, wherein the first electrode extends in a first direction and the second electrode extends in a second direction crossing the first direction, wherein the first and second inner regions are formed at a crossing between the first electrode and the second electrode.

11. The resistive switching memory device according to claim 10, wherein the first and second inner regions form a storage element of the memory device, and wherein the memory device does not include a selector element between the first and second electrodes.

12. The resistive switching memory device according to claim 11, wherein the memory device is integrated as part of a cross-point array or a vertical resistive random access memory (RRAM) string.

13. The resistive switching memory device according to claim 1, wherein the second inner region is formed of a material comprising amorphous silicon.

14. A method of fabricating a resistive switching memory device, the method comprising:

forming a first electrode;

forming a first inner region over the first electrode comprising one or more metal oxide layers;

forming a second inner region contacting the first inner region, the second inner region consisting of a plurality of layers, each of the layers being an insulating, a semi-insulating or a semiconducting layer; and forming a second electrode over the first and second inner regions such that the first and second inner regions are interposed between the first and second electrodes, wherein the second inner region comprises one or more layers having a stoichiometric or off-stoichiometric composition of a material selected from the group consisting of $SiGe_x$, $AlO_x$, $MgO_x$, $AlN_x$, $SiN_x$, $HfO_x$, $HfSiO_x$, $ZrO_x$, $ZrSiO_x$, $GdAlO_x$, $DyScO_x$, $TaO_x$ and combinations thereof, wherein the second inner region comprises one or more silicon-containing layers that contact the first inner region, wherein the second inner region is configured to scavenge oxygen from the first inner region, and wherein the second inner region has a nonlinear charge carrier conduction mechanism that is dominant under an applied voltage or electric field.

15. The method according to claim 14, wherein the first and second electrodes extend in different directions such that the first electrode and the second electrode cross one another, and wherein the first and second electrodes are formed in substantially parallel planes.

16. The method according to claim 15, wherein the first and second inner regions are formed in different planes that are parallel to the planes in which the first and second electrodes are formed.

17. The method according to claim 14, wherein the first and second inner regions are formed using a conformal coating process.

18. A method of operating the resistive switching memory device of claim 1, the method comprising:

writing the resistive switching memory device comprising performing one of a reset operation or a set operation, wherein the reset operation comprises increasing the resistance of the resistive switching memory device from a low resistive state to a high resistive state by applying a first voltage having a first polarity to the first electrode relative to the second electrode, and wherein a set operation comprises decreasing the resistance of the resistance switching memory device from the high resistive state to the low resistive state by applying a second voltage having a second polarity opposite the first polarity to the first electrode relative to the second electrode.

19. The method according to claim 18, further comprising, after writing, reading the resistive switching memory device, reading comprising applying a third voltage having the same polarity as the first voltage and a magnitude smaller than the first voltage.

* * * * *

UNITED STATES PATENT AND TRADEMARK OFFICE
CERTIFICATE OF CORRECTION

PATENT NO. : 10,490,738 B2
APPLICATION NO. : 15/625941
DATED : November 26, 2019
INVENTOR(S) : Bogdan Govoreanu Page 1 of 1

It is certified that error appears in the above-identified patent and that said Letters Patent is hereby corrected as shown below:

On the Title Page

Column 2, item (57), Abstract, Line 12, delete "AIN$_x$," and insert --AlN$_x$,--.

In the Specification

Column 5, Line 45, delete "ore" and insert --or--.

Column 10, Line 2, delete "V2O$_5$" and insert --V$_2$O$_5$--.

Column 16, Line 26, delete "SI," and insert --$\Omega$,--.

In the Claims

Column 16, Line 60, Claim 1, delete "AIN$_x$," and insert --AlN$_x$,--.

Column 17, Lines 14-15, Claim 4, delete "according claim" and insert --according to claim--.

Column 17, Line 38, Claim 9, delete "TiAIN," and insert --TiAlN,--.

Column 18, Line 14 (approx.), Claim 14, delete "AIN$_x$," and insert --AlN$_x$,--.

Signed and Sealed this
Ninth Day of June, 2020

Andrei Iancu
*Director of the United States Patent and Trademark Office*